(12) United States Patent
Rountree

(10) Patent No.: US 9,035,363 B2
(45) Date of Patent: May 19, 2015

(54) JFET ESD PROTECTION CIRCUIT FOR LOW VOLTAGE APPLICATIONS

(71) Applicant: Robert Newton Rountree, Cotopaxi, CO (US)

(72) Inventor: Robert Newton Rountree, Cotopaxi, CO (US)

( * ) Notice: Subject to any disclaimer, the term of this patent is extended or adjusted under 35 U.S.C. 154(b) by 0 days.

(21) Appl. No.: 14/449,283

(22) Filed: Aug. 1, 2014

(65) Prior Publication Data

US 2014/0339608 A1   Nov. 20, 2014

Related U.S. Application Data

(63) Continuation-in-part of application No. 13/772,105, filed on Feb. 20, 2013, now Pat. No. 8,866,200.

(60) Provisional application No. 61/601,186, filed on Feb. 21, 2012.

(51) Int. Cl.
| | |
|---|---|
| *H01L 27/085* | (2006.01) |
| *H01L 27/02* | (2006.01) |
| *H01L 27/092* | (2006.01) |
| *H01L 27/06* | (2006.01) |

(52) U.S. Cl.
CPC .......... *H01L 27/0266* (2013.01); *H01L 27/085* (2013.01); *H01L 27/092* (2013.01); *H01L 27/0629* (2013.01)

(58) Field of Classification Search
CPC ............ H01L 27/0266; H01L 27/0629; H01L 27/092; H01L 27/085
USPC ......... 257/134, 213, 256, 173, 272, 274, 287, 257/504, E27.148, E29.265, E29.314, 257/E21.403, E21.407, E21.401, E21.421; 438/186; 327/430
See application file for complete search history.

(56) References Cited

U.S. PATENT DOCUMENTS

| | | |
|---|---|---|
| 4,939,616 A | 7/1990 | Rountree |
| 5,012,317 A | 4/1991 | Rountree |
| 5,296,409 A | 3/1994 | Merrill et al. |
| 5,465,189 A | 11/1995 | Polgreen et al. |
| 5,670,393 A | 9/1997 | Kapoor |
| 6,239,958 B1 | 5/2001 | Kato et al. |
| 6,251,716 B1 | 6/2001 | Yu |
| 6,303,947 B1 * | 10/2001 | Ueno ............................ 257/77 |
| 6,774,417 B1 * | 8/2004 | Lin et al. ...................... 257/287 |
| 7,009,229 B1 | 3/2006 | Lin et al. |
| 7,164,160 B2 | 1/2007 | Pendharker et al. |
| 7,211,845 B1 | 5/2007 | Yu et al. |
| 7,655,964 B1 | 2/2010 | Lin et al. |
| 2005/0173726 A1 | 8/2005 | Potts |
| 2009/0285414 A1 | 11/2009 | Wu |
| 2011/0220973 A1 | 9/2011 | Hu et al. |

\* cited by examiner

*Primary Examiner* — Selim Ahmed

(57) ABSTRACT

An electrostatic discharge (ESD) protection circuit is disclosed. The circuit includes a first region having a first conductivity type (410) is formed at a face of a substrate. A gate having a second conductivity type (406) is formed in the substrate beside the first region. A channel having the first conductivity type is formed below the first region adjacent the gate. A second region having the first conductivity type (404) is formed at the face of the substrate beside the gate. A third region having the first conductivity type (430) is formed below the channel and has a greater impurity concentration than the channel.

19 Claims, 4 Drawing Sheets

JFET ESD PROTECTION CIRCUIT FOR LOW VOLTAGE APPLICATIONS

This application is a continuation-in-part of Nonprovisional application Ser. No. 13/772,105, filed Feb. 20, 2013, which claims the benefit under 35 U.S.C. §119(e) of Provisional Appl. No. 61/601,186, filed Feb. 21, 2012, both of which are incorporated herein by reference in their entirety.

BACKGROUND OF THE INVENTION

Embodiments of the present embodiments relate to a CMOS-compatible junction field effect transistor (JFET) for electrostatic discharge (ESD) protection of low-voltage integrated circuits.

Referring to FIG. 1A, there is a current-voltage diagram of a semiconductor controlled rectifier (SCR) of the prior art. FIG. 1B is a simplified diagram of the SCR showing the PNPN impurity layers and intervening junctions J1-J3. The current-voltage diagram shows a reverse blocking region 100 where junctions J1 and J3 are reverse biased, but junction J2 is forward biased. By way of contrast, junctions J1 and J3 are forward biased, but junction J2 is reverse biased in the forward blocking region 102. At switching voltage Vsw 104, the SCR switches from the forward blocking region to a minimum holding voltage (Vh) and holding current (Ih) region 106. Each point along line 108 is a relatively higher holding current and holding voltage, and the slope of line 108 represents the on resistance of the SCR. In this mode all three junctions J1-J3 are forward biased and the minimum holding voltage across the SCR may be as low as a single diode drop or approximately 0.7 V. In holding regions 106 and 108, therefore, the SCR functions as a near ideal switch with very little power dissipation due to the low holding voltage and holding current.

SCRs have been used for primary protection against electrostatic discharge (ESD) for several years. Rountree first disclosed a lateral SCR for ESD protection in U.S. Pat. No. 5,012,317, issued Apr. 30, 1991, having a priority date of at least Apr. 14, 1986. The SCR was also described in detail by Rountree et al. in "A Process Tolerant Input Protection Circuit for Advanced CMOS Processes" (EOS/ESD Symposium Proceedings, pp. 201-205, 1988). The SCR provided a significant improvement in failure threshold over existing ESD protection circuits. However, it required a relatively high switching voltage (Vsw) to induce avalanche conduction at the N– and P– linear junction J2.

Rountree subsequently disclosed a low voltage SCR for ESD protection in U.S. Pat. No. 4,939,616, issued Jul. 3, 1990, having a priority date of at least Nov. 1, 1988. The low voltage SCR maintained the substantially improved failure threshold of the original lateral SCR. The low voltage SCR also substantially reduced the switching voltage (Vsw) required for avalanche conduction by forming an abrupt junction J2 between N+ and P– regions.

Polgreen et al. later disclosed an even lower voltage SCR for ESD protection in U.S. Pat. No. 5,465,189, issued Nov. 7, 1995, having a priority date of at least Mar. 5, 1990. This SCR modified the SCR of U.S. Pat. No. 4,939,616 by adding a grounded gate n-channel transistor between junctions J2 and J3. The increased electric field at the gate-to-drain overlap region near junction J2 induced avalanche conduction at the SCR switching voltage, which was substantially lower than previously disclosed lateral SCRs. (col. 4, lines 30-35). At the same time, the SCR raised several reliability concerns, because the SCR functioned as a grounded gate n-channel transistor between the forward blocking region 102 and the switching voltage 104. For some processes and test conditions, therefore, it is possible that the gate oxide at the gate-to-drain overlap region near junction J2 may rupture before the SCR turns on.

A common feature of the foregoing SCRs is that the switching voltage of each is determined by the avalanche threshold of p-n junction J2. Other circuits have included secondary protection circuits, such as an isolation resistor and grounded gate n-channel transistor, to achieve a relatively lower switching voltage. This, however, requires the avalanche threshold of the n-channel transistor plus the voltage drop across the isolation resistor to forward bias junction J1. Others have used series-connected diodes to forward bias junction J1 or J3. Still others have used junction-isolated base regions to reduce SCR switching (Vsw) and holding (Vh) voltages. This, however, may require a triple well process or other special isolation techniques. Moreover, the SCRs are negative resistance circuits. Any application of a low impedance control signal before the integrated circuit is adequately powered up, therefore, may cause the SCR to latch and destroy itself. The foregoing SCR protection circuits become less effective as integrated circuit operating voltages are reduced to less than 1.0 V. At such low voltages, integrated circuit components having thin gate oxide and small feature sizes may be damaged at SCR switching and holding voltages. These and other problems are resolved by the following embodiments of the present invention as will become apparent in the following discussion.

BRIEF SUMMARY OF THE INVENTION

In a preferred embodiment of the present invention, an electrostatic discharge (ESD) protection circuit is disclosed. The circuit includes a first region having a first conductivity type formed at a face of a substrate. A gate is formed in the substrate beside the first region. A channel having the first conductivity type is formed below the first region beside the gate. A second region having the first conductivity type is formed at the face of the substrate beside the gate. A third region having the first conductivity type is formed below the channel and has a greater impurity concentration than the channel.

DETAILED DESCRIPTION OF THE INVENTION

The preferred embodiments of the present invention provide significant advantages over electrostatic discharge (ESD) protection circuits of the prior art as will become evident from the following detailed description.

Figure 1A:
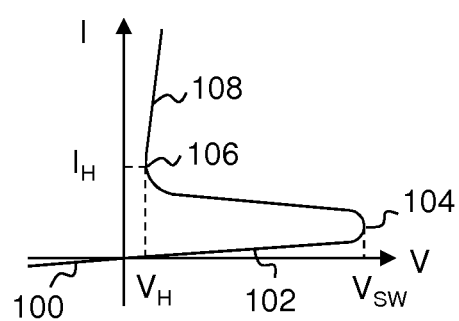
FIG. 1A is a current-voltage diagram of a semiconductor controlled rectifier (SCR) of the prior art.
Figure 1B:
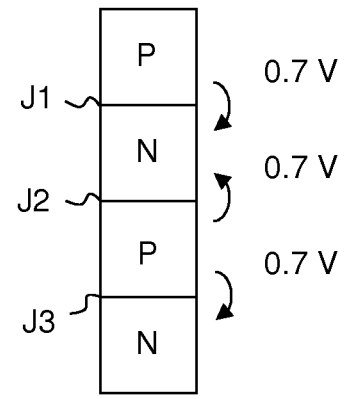
FIG. 1B is a simplified diagram of an SCR of the prior art.
Figure 2:
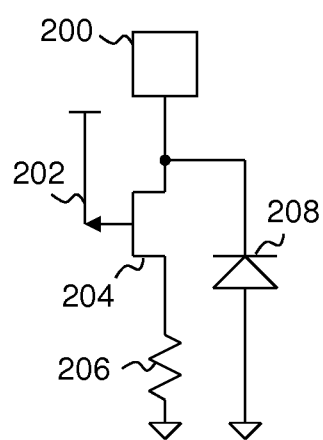
FIG. 2 is a schematic diagram of a junction field effect (JFET) electrostatic discharge (ESD) protection circuit of the present invention.

Referring to FIG. 2, there is a schematic diagram of a junction field effect (JFET) electrostatic discharge (ESD) protection circuit of the present invention. The circuit is coupled to a first terminal 200, which may be a data terminal, an address terminal, or a control terminal. Here and in the following discussion the same identification numerals are used to indicate the same elements. By way of example, JFET 204 is a p-channel, enhancement mode JFET. One of ordinary skill in the art having access to the instant specification will understand embodiments of the present invention will apply to an n-channel enhancement mode JFET as well. The enhancement mode JFET 204 is "normally off" when the gate-to-source voltage (Vgs) is greater (more positive) than or equal to 0 V. JFET 204 has a current path coupled between the first terminal 200 and power supply terminal Vss or ground, indicated by the small triangle, via resistor 206. Resistor 206 represents channel resistance and parasitic substrate resistance as will be discussed in detail. A control terminal 202 of the JFET is coupled to power supply terminal Vdd. A diode 208 is also coupled between the first terminal 200 and Vss.

Figure 3:
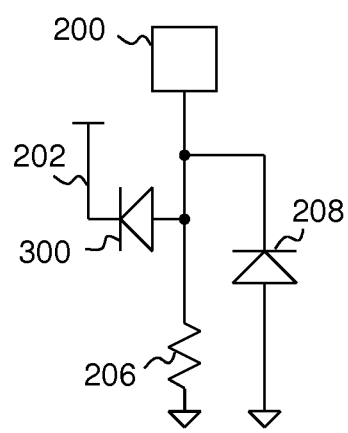
FIG. 3 is a schematic diagram of an equivalent circuit of the circuit of FIG. 2 when gate-to-source voltage exceeds the JFET threshold voltage.

In operation, the JFET 204 conducts positive ESD stress current between terminal 200 and ground, and diode 208 conducts negative ESD stress current between terminal 200 and ground. When positive power supply voltage Vdd is applied to control terminal 202, the integrated circuit is powered up and the voltage at terminal 200 is no greater than Vdd. Thus, Vgs is greater than or equal to 0 V for normal circuit operation. In this mode, JFET 204 is off and no current flows through resistor 206. When a positive voltage such as during ESD stress is applied to terminal 200, the JFET conducts current to ground through resistor 206. This mode of operation is illustrated by the equivalent circuit of FIG. 3. Here, JFET 204 is on and has a low channel resistance and substrate resistance 206. Positive ESD stress applied to terminal 200 in this mode will be conducted to ground and through resistor 206 and to Vdd through diode 300 with very little power dissipation. This mode of operation is highly advantageous for several reasons. First, there are no switching or holding voltages to potentially damage integrated circuits operating at very low voltages. Second, the protection circuit operates in a positive resistance mode, so there is no danger as with negative resistance circuits of the prior art which utilize snapback or latchup. For example, the circuit can not latch and destroy itself or preferentially current hog at isolated regions of the JFET. Third, the JFET operates in a very low resistance mode during ESD stress, so there is very little power dissipation and resulting heat generation. Fourth, no thin oxide MOS transistors are required by the protection circuit that might be damaged by overvoltage during ESD stress. Finally, the protection circuit is compatible with present complementary metal oxide semiconductor processes as will be discussed in detail.

Figure 4:
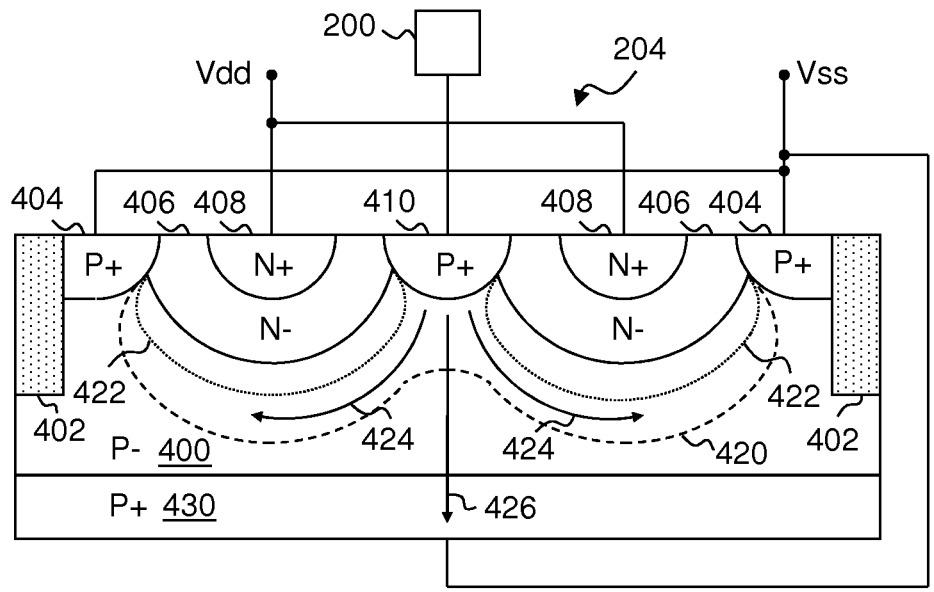
FIG. 4 is a cross sectional diagram of a p-channel JFET of the present invention.

Turning now to FIG. 4, there is a cross sectional diagram of JFET 204 of FIG. 2. Here and in the following discussion, heavily doped regions are indicated by a "+" and lightly doped regions are indicated by a "−". This designation indicates that the heavily doped regions have a much higher impurity concentration than the lightly doped regions. The JFET 204 includes P+ source region 410 connected to terminal 200 and a gate formed by N− regions 406. N− gate regions 406 are electrically connected to power supply terminal Vdd by N+ regions 408. A lateral drain is formed by P+ regions 404. A vertical drain region below source region 410 is formed by P− region 400 and P+ region 430. In a preferred embodiment of the present invention, P+ region 430 preferably has a higher P-type impurity concentration than P− region 400. Regions 404, 400, and 430 are electrically connected to the Vss power supply terminal. JFET 204, therefore, has both a lateral current path 424 between P+ source 410 and P+ drain terminals 404 as well as a vertical current path 426 between P+ source 410 and P− region 400 and P+ substrate 430. Due to the electrically parallel lateral and vertical current paths, the on resistance of JFET 204 including resistance 206 is small. JFET 204 is preferably bounded by isolation regions 402.

Figure 5:
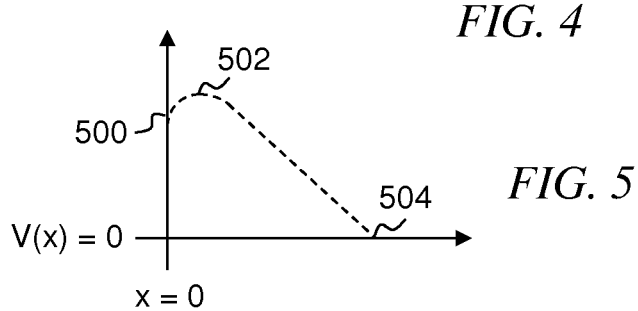
FIG. 5 is a potential diagram along the channel region of the JFET of FIG. 4 during normal circuit operation.

In normal operation, JFET 204 is designed as an enhancement mode p-channel JFET. Two conditions are necessary for enhancement mode operation. First, the channel must be fully depleted when Vgs is greater than or equal to 0 V. Second, the built-in voltage at the center of the channel must be greater than the source voltage. Often, when one of these conditions is met, the other is also satisfied. Here, the first condition is illustrated by N−/P− depletion edge 420 during normal operation. The channel region between P+ source 410 and P− region 400 is completely depleted. FIG. 5 is a potential diagram illustrating the potential V(x) from the P+ source 410 to depletion edge 420 through the center of the channel. The value of V(x) 500 at x=0 is the most positive value of the P+ source 410 during normal circuit operation. The value of V(x) 504 at depletion edge 420 is approximately Vss, since no current flows through the JFET during normal circuit operation. The value of V(x) at 502 is slightly more positive than the source potential at 500 due to the built-in voltage of the N−/P− junctions. This satisfies the second condition for enhancement mode operation. For typical CMOS processes having a P− well impurity concentration of 6e15 A/cm^3 to 1e16 A/cm^3 and N− well impurity concentration of 4e16 A/cm^3, both conditions are typically satisfied for the N− to P− linear junction with a gate spacing of approximately 0.8 µm to 0.5 µm. The gate space should also be designed to maintain an enhancement mode threshold voltage for JFET 204 over the entire range of operating temperature.

As positive voltage is applied to terminal 200 of JFET 204, Vgs becomes increasingly negative. The gate depletion region narrows to depletion edges 422, and a conductive channel forms in the center of JFET 204. As previously discussed, the channel has both a lateral current path 424 between P+ source 410 and P+ drain terminals 404 as well as a vertical current path 426 between P+ source 410 and P− region 400 and P+ region 430. These electrically parallel lateral and vertical current paths produce a very low on resistance of JFET 204 having resistance 206, so there is little heat generation during an ESD event.

Figure 6A:
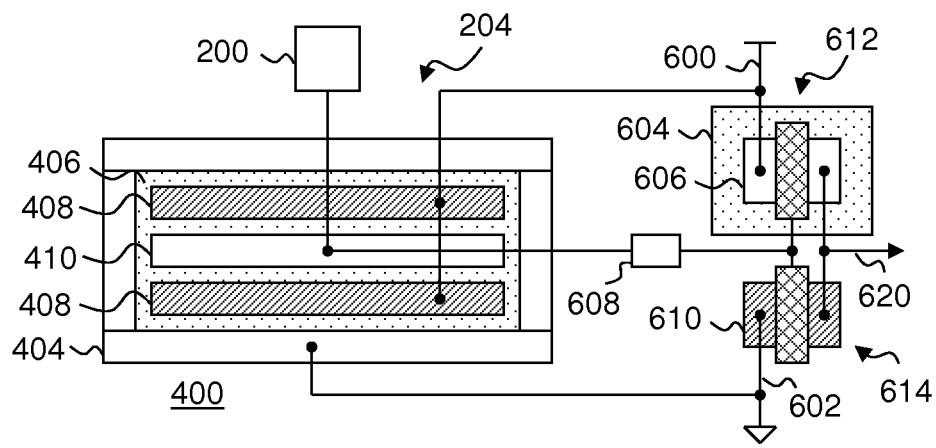
FIG. 6A is a simplified layout diagram of the JFET of FIG. 4 and a typical CMOS inverter.

Referring now to FIG. 6A, there is a simplified layout of JFET 204 of FIG. 4 and a typical CMOS inverter. The P+ source 410 of JFET 204 is connected to terminal 200. The P− drain 400 and P+ drains 404 are connected to ground or Vss 602. The N+/N− gate regions 408 and 406, respectively, are connected to Vdd power supply terminal 600. The CMOS inverter includes p-channel transistor 612 and n-channel transistor 614. The input of the CMOS inverter is connected to the P+ source 410 by isolation stage 608. The isolation stage is optional and may be an isolation resistor and diode or similar structure as is known in the art. The output terminal 620 is connected to internal circuitry of the integrated circuit. In a preferred embodiment of the present invention, N− region 604 is formed by the same ion implantation step as N− gate region 406. N+ region 610 is formed by the same ion implantation step as N+ gate region 408. Likewise, P+ region 606 is formed by the same ion implantation step as P+ source region 410 and P+ drain regions 404. This is highly advantageous, and renders JFET 204 of the present invention compatible with typical CMOS processes.

Figure 6B:
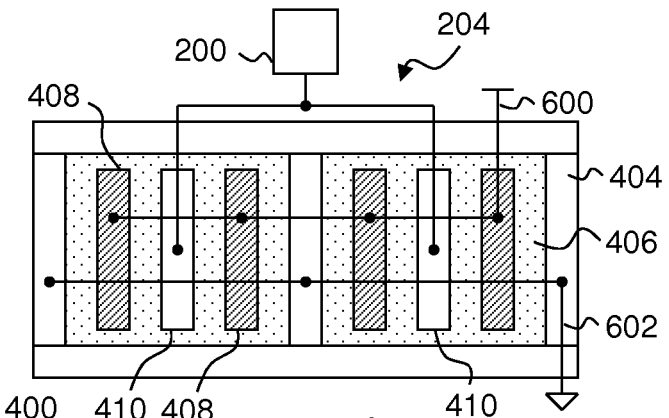
FIG. 6B is another simplified layout diagram of the JFET of FIG. 4.

Referring to FIG. 6B, there is another simplified layout of JFET 204 of FIG. 4. The P+ sources 410 of JFET 204 are connected to terminal 200. The P− drain 400 and P+ drains 404 are connected to ground or Vss 602. The N+/N− gate regions 408 and 406, respectively, are connected to Vdd power supply terminal 600. This embodiment of the present invention having distributed source regions 410 is highly advantageous in providing multiple parallel JFETs that may be included with output circuits as in FIG. 7. A distributed layout of JFET 204 as in FIG. 6B is not practical with negative resistance circuits that operate in snapback or latchup modes. This is because any one of the negative resistance circuits might turn on first and prevent operation of the other negative resistance circuits. The JFET of FIG. 6B, however, is a positive resistance circuit and precludes current such hogging.

Figure 7:
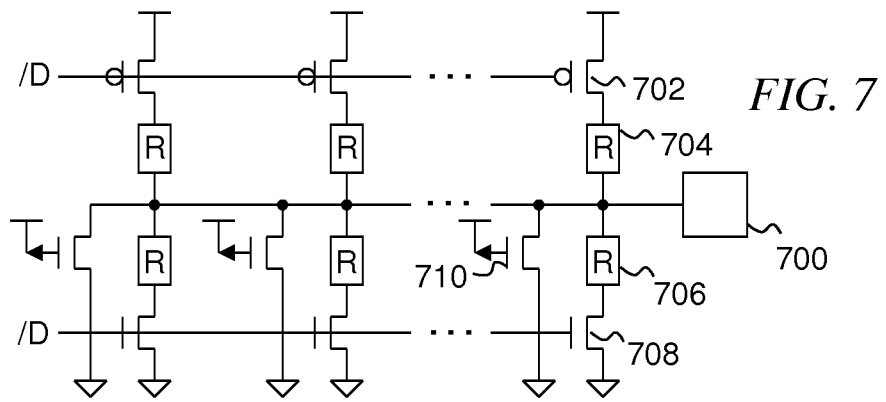
FIG. 7 is a schematic diagram of a data output circuit having the JFET ESD protection circuit of FIG. 4.

Turning now to FIG. 7, there is a schematic diagram of a data output circuit having the JFET ESD protection circuit of FIG. 4. The output circuit of FIG. 7 is a multiple finger output circuit having a distributed JFET protection circuit of the present invention. Here, only three fingers of the output circuit are shown for simplicity. Each finger includes a p-channel transistor 702 connected to output terminal 700 by series resistor 704. Each finger further includes an n-channel transistor 708 connected to output terminal 700 by series resistor 706. Each finger is preferably protected by a respective JFET 710 of the present invention. JFET 710 operates as previously described, but it is divided into multiple JFETs for inclusion within the output circuit. As previously mentioned with regard to JFET 204, each JFET 710 is a positive resistance device. Thus, there is no danger of current hogging by any single finger.

Figure 8:
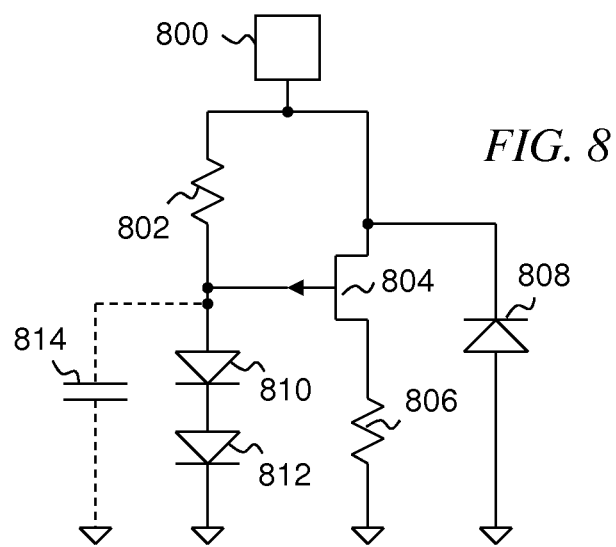
FIG. 8 is a schematic diagram of a power supply protection circuit having the JFET ESD protection circuit of FIG. 4.

Referring to FIG. 8, there is a schematic diagram of a power supply protection circuit having the JFET ESD protection circuit of FIG. 4. The power supply protection circuit includes JFET 804 connected between Vdd terminal 800 and Vss. JFET 804 may be structurally the same as JFET 204. JFET 804 preferably conducts positive ESD stress current between terminal 800 and ground, and diode 808 conducts negative ESD stress current between terminal 800 and ground. Resistor 806 is preferably the same as resistor 206 (FIG. 2). A control terminal of JFET 804 is connected to Vdd terminal 800 by resistor 802. The control terminal of JFET 804 is also connected to the Vss terminal by series-connected diodes 810 and 812. Capacitor 814 is optional and may be connected in parallel with diodes 810 and 812.

In operation, the power supply protection circuit of FIG. 8 remains off during normal circuit operation. JFET 804 is designed as an enhancement mode device, having the source and control gate connected to Vdd terminal 800. For normal circuit operation, therefore, Vgs=0 and JFET 804 remains off. Moreover, for a power supply voltage of less than 1.2 V, diodes 810 and 812 are not forward biased and remain off. During a normal power up cycle, capacitor 814 and resistor 802 are designed with a sufficiently small time constant that JFET 804 is never on.

When a positive ESD voltage is applied to terminal 800 with respect to Vss, JFET 804 will turn on in one of two ways. First, if the rise time of the ESD voltage is sufficient to overcome the time constant of resistor 802 and capacitor 814, JFET 804 will turn on when Vgs exceeds the threshold voltage. For example, if the integrated circuit is not powered up and the control terminal of JFET 804 is floating near Vss potential, a voltage greater than Vgs at terminal 800 will turn on JFET 804 and discharge the ESD stress voltage. Second, series diodes 810 and 812 clamp the control terminal of JFET 804 at two diode drops above Vss. An additional threshold voltage across resistor 802 will turn on JFET 804 without regard to the rise time of the ESD stress voltage. If the rise time of the ESD voltage is slow, therefore, a voltage of two diode drops plus a threshold voltage at terminal 800 will turn on JFET 804 and discharge the ESD stress voltage. This is highly advantageous in providing ESD protection for fast rise time ESD tests such as the charged device model (CDM) test and the machine model (MM) test as well as slower rise time tests such as the human body model test (HBM).

Figure 9A:
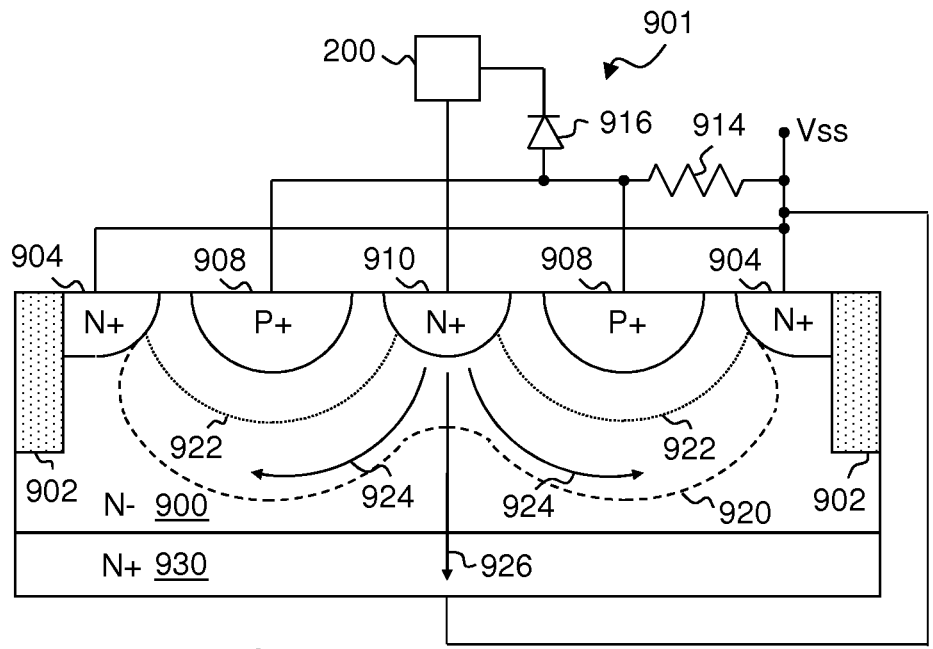
FIGS. 9A-9B are cross sectional diagrams of n-channel JFETs of the present invention.

Referring now to FIG. 9A, there is a cross sectional diagram of a first embodiment of an n-channel JFET 901 that may be used rather than the p-channel JFET 204 of FIG. 2. The n-channel JFET includes N+ drain region 910 connected to terminal 200 and a gate formed by P+ regions 908. P+ gate regions 908 have a slightly greater junction depth than N+ drain region 910 and form a channel below drain region 910. Simulations have shown that a differential junction depth of as little as 10 nm may be sufficient to form an enhancement mode channel. Gate region 908 is biased by diode 916 and resistor 914. Here, diode 916 is preferably formed by N+ drain 910, N− region 900, and P+ gate 908. Thus a space between N+ drain 910 and P+ gate 908 preferably determines an avalanche voltage of diode 916 and subsequent activation voltage of the JFET. A lateral source region is formed by N+ regions 904. A vertical source region below drain region 910 is formed by N− region 900 and N+ region 930. In a preferred embodiment of the present invention, N+ region 930 may be a substrate or buried layer formed by ion implantation. Regions 904, 900, and 930 are electrically connected to the Vss power supply terminal or other suitable power supply terminal. The JFET, therefore, has both a lateral current path 924 between N+ drain 910 and N+ source terminals 904 as well as a vertical current path 926 between N+ drain 910 and N− region 900 and N+ region 930. Due to the electrically parallel lateral and vertical current paths, the on resistance of the JFET is small. The JFET 901 is preferably bounded by isolation regions 902.

In normal operation, JFET 901 is designed as an enhancement mode n-channel JFET. Resistor 914 holds Vgs to 0 V as long as the voltage at terminal 200 does not exceed the avalanche threshold of diode 916. The channel must be fully depleted when Vgs is less than or equal to 0 V, and the built-in voltage at the center of the channel must be less than the source voltage. The first condition is illustrated by N−/P+ depletion edge 920 during normal operation. The channel region between N+ drain 910 and N− region 900 is completely depleted. The built-in voltage at the center of the channel is slightly negative with respect to N− region 900 and N+ region 930 and satisfies the second condition for enhancement mode operation.

Figure 9B:
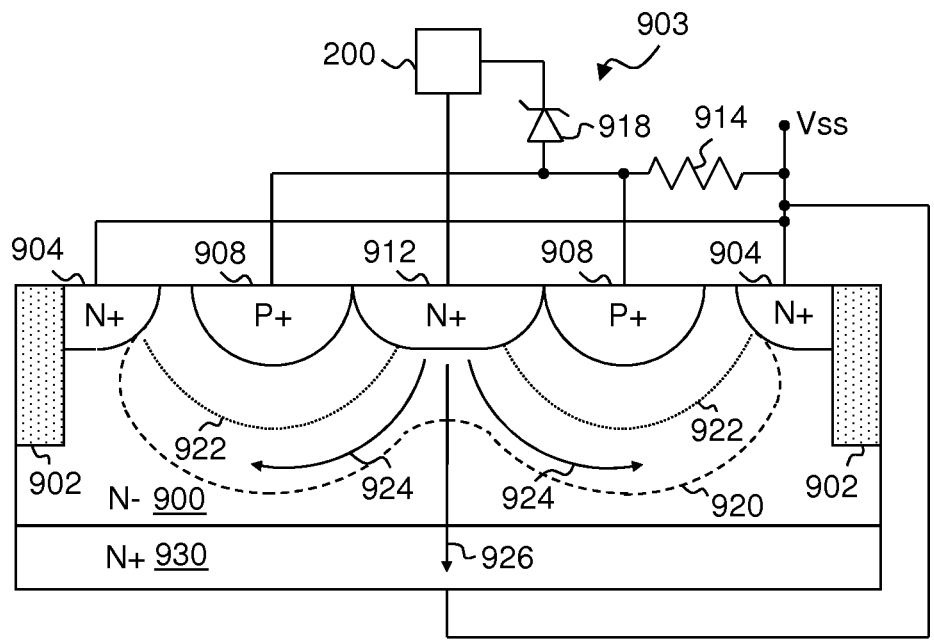

As positive voltage is applied to terminal 200 of JFET 901 during an ESD event, diode 916 begins avalanche conduction. The avalanche current produces a positive voltage across resistor 914 to forward bias gate region 908 with respect to N− source region 900. The gate depletion region narrows to depletion edges 922, and a conductive channel forms in the center of JFET 901. As previously discussed, the channel has both a lateral current path between N+ drain 910 and N+ source terminals 904 as well as a vertical current path between N+ drain 910 and N− region 900 and N+ region 930. These electrically parallel lateral and vertical current paths produce a very low on resistance of JFET 901, so there is little heat generation during an ESD event FIG. 9B is a cross sectional diagram of a second embodiment of an n-channel JFET 903 that may be used rather than the p-channel JFET 204 of FIG. 2. The n-channel JFET 903 is similar to the n-channel JFET 901 of FIG. 9A except that N+ drain region 912 abuts P+ gate 908. Contact between N+ drain 912 and P+ gate 908 forms a zenner diode 918 having a substantially lower avalanche voltage than diode 916. This advantageously provides a lower activation voltage compatible with low voltage circuits.

Still further, while numerous examples have thus been provided, one skilled in the art should recognize that various modifications, substitutions, or alterations may be made to the described embodiments while still falling with the inventive scope as defined by the following claims. For example, reverse biased diodes 916 (FIG. 9A) and 918 (FIG. 9B) might be replaced with series-connected forward biased diodes to further reduce activation voltage of the JFET. Alternatively, metal oxide semiconductor (MOS) transistors connected as diodes may replace pn junction diodes to further control the JFET activation voltage. Other combinations will be readily apparent to one of ordinary skill in the art having access to the instant specification.

What is claimed is:

1. A circuit, comprising:
    a first region having a first conductivity type formed at a face of a substrate;
    a first power supply terminal coupled to the first region;
    a gate having a second conductivity type formed in the substrate beside the first region;
    a channel having the first conductivity type formed below the first region adjacent the gate;
    a second region having the first conductivity type formed at the face of the substrate beside the gate;
    a third region coupled to the second region, having the first conductivity type, formed below the channel, and having a greater impurity concentration than the channel; and
    a second power supply terminal coupled to the second and third regions.

2. A circuit as in claim 1, wherein the channel is arranged to conduct a first electrostatic discharge (ESD) current from the first region to the second region and a second ESD current from the first region to the third region in response to a voltage applied to the gate.

3. A circuit as in claim 1, wherein the first region is coupled to one of a data terminal, an address terminal, and a control terminal.

4. A circuit as in claim 1, wherein the gate comprises a heavily doped region formed at least partially within a lightly doped region.

5. A circuit as in claim 1, wherein the first region is coupled to the gate by a resistor.

6. A circuit as in claim 1, comprising a P-channel enhancement mode junction field effect transistor.

7. A circuit as in claim 1, comprising an N-channel enhancement mode junction field effect transistor.

8. A circuit as in claim 1, comprising:
    a P-channel metal oxide semiconductor (MOS) transistor having a source coupled to a first power supply terminal and a drain coupled to the first region; and
    an N-channel MOS transistor having a source coupled to a second power supply terminal and a drain coupled to the first region.

9. A circuit as in claim 8, wherein the source of the P-channel transistor and the first region are formed by a same ion implantation step.

10. A circuit as in claim 8, wherein the source of the N-channel transistor and the first region are formed by a same ion implantation step.

11. An electrostatic discharge (ESD) protection circuit, comprising:
    a first terminal formed at a face of a substrate;
    a gate formed in the substrate beside the first terminal;
    a second terminal formed at the face of the substrate beside the gate;
    a third terminal formed below the first terminal; and
    a channel arranged to conduct a first current between the first terminal and the second terminal and a second current between the first terminal and the third terminal in response to an activation voltage.

12. An ESD protection circuit as in claim 11, wherein the activation voltage is determined by a voltage between the first terminal and the gate.

13. An ESD protection circuit as in claim 11, wherein the activation voltage is determined by a space between the first terminal and the gate.

14. An ESD protection circuit as in claim 11, wherein the first terminal abuts the gate.

15. An ESD protection circuit as in claim 11, comprising:
    a diode coupled between the first terminal and the gate; and
    a resistor coupled between the gate and the second terminal.

16. An ESD protection circuit as in claim 11, wherein the third terminal is a buried layer formed below the face of the substrate by ion implantation.

17. A circuit, comprising:
    a plurality of first regions having a first conductivity type formed at a face of a substrate;
    a plurality of gates having a second conductivity type formed in the substrate beside each first region;
    a plurality of channels having the first conductivity type formed below each first region adjacent respective gates;
    a plurality of second regions having the first conductivity type formed at the face of the substrate beside a respective gate opposite a respective first region, wherein each of the second regions is coupled to a terminal; and
    a third region coupled to the terminal and having the first conductivity type formed below the channels and having a greater impurity concentration than the channels.

18. A circuit as in claim 17, comprising a plurality of enhancement mode junction field effect transistors.

19. A circuit as in claim 17, comprising:
    a plurality of P-channel metal oxide semiconductor (MOS) transistors, each P-channel MOS transistor having a source coupled to a first power supply terminal and a drain coupled to a respective first region; and
    a plurality of N-channel MOS transistors, each N-channel MOS transistor having a source coupled to a second power supply terminal and a drain coupled to the respective first region.

* * * * *